(12) United States Patent
Yamashita et al.

(10) Patent No.: US 7,046,468 B2
(45) Date of Patent: May 16, 2006

(54) SEMICONDUCTOR INTEGRATED CIRCUIT AND MAGNETIC STORAGE DEVICE USING THE SAME

(75) Inventors: Hiroki Yamashita, Hachioji (JP); Masayoshi Yagyu, Hanno (JP); Fumio Yuuki, Kamifukuoka (JP); Tatsuya Kawashimo, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/030,067

(22) Filed: Jan. 7, 2005

(65) Prior Publication Data

US 2005/0207228 A1    Sep. 22, 2005

(30) Foreign Application Priority Data

Mar. 17, 2004    (JP)    ............................ 2004-075526

(51) Int. Cl.
  *G11B 5/02*    (2006.01)
(52) U.S. Cl. ....................................... 360/68
(58) Field of Classification Search ................. 360/68, 360/55, 64, 67, 69, 25, 27, 75; 330/252, 330/257, 277; 365/189.09, 233; 327/105, 327/110, 108, 112, 427; 235/493; 341/155; 307/126, 130

See application file for complete search history.

(56) References Cited

U.S. PATENT DOCUMENTS

| | | | |
|---|---|---|---|
| 6,114,905 A * | 9/2000 | Hashimoto et al. | ......... 330/252 |
| 6,163,218 A * | 12/2000 | Hashimoto et al. | ......... 330/257 |
| 6,218,903 B1 * | 4/2001 | Hashimoto et al. | ......... 330/277 |
| 6,222,780 B1 | 4/2001 | Takahashi | |
| 6,335,901 B1 * | 1/2002 | Morita et al. | ................ 365/233 |
| 6,414,806 B1 * | 7/2002 | Gowda et al. | ................ 360/25 |
| 6,477,090 B1 * | 11/2002 | Yamaki et al. | ......... 365/189.09 |
| 6,515,519 B1 * | 2/2003 | Miyazaki et al. | ........... 327/105 |
| 6,659,352 B1 * | 12/2003 | Asada et al. | ................ 235/492 |

(Continued)

FOREIGN PATENT DOCUMENTS

JP    5-152926    6/1993

(Continued)

OTHER PUBLICATIONS

2000 IEEE International Solid-State Circuits Conference Digest of Technical Papers, "A 550 Mb/s GMR Read-Write Amplifier Using 0.5um 5 V CMOS Process", Lam et al, pp. 358-359.

*Primary Examiner*—David Hudspeth
*Assistant Examiner*—Fred F. Tzeng
(74) *Attorney, Agent, or Firm*—Mattingly, Stanger, Malur & Brundidge, P.C.

(57) ABSTRACT

The present invention provides a semiconductor integrated circuit capable of reducing a circuit area and a magnetic storage device using the same. The circuit in the present invention is provided with a single-stage output transistor for supplying write current to a magnetic head, a current source for outputting reference current of the write current, a diode-connected NMOS transistor for converting the current to gate voltage and having a certain device size ratio to the output transistor, a regulator circuit for transmitting gate voltage of the NMOS transistor and reducing output impedance, and a CMOS circuit for setting power supply voltage to an output of the regulator circuit and controlling the gate voltage of the output transistor. Then, this circuit is applied as a write circuit in a magnetic storage device.

12 Claims, 9 Drawing Sheets

U.S. PATENT DOCUMENTS

| | | | |
|---|---|---|---|
| 6,754,133 B1 * | 6/2004 | Morita et al. | 365/233 |
| 6,781,423 B1 * | 8/2004 | Knoedgen | 327/110 |
| 6,879,188 B1 * | 4/2005 | Miyazaki et al. | 327/105 |
| 6,963,298 B1 * | 11/2005 | Otsuka et al. | 341/155 |
| 2003/0142432 A1 * | 7/2003 | Yoshizawa et al. | 360/67 |

FOREIGN PATENT DOCUMENTS

| | | |
|---|---|---|
| JP | 8-107344 | 4/1996 |
| JP | 2000-260186 | 9/2000 |
| JP | 2002-290230 | 10/2002 |

* cited by examiner

SEMICONDUCTOR INTEGRATED CIRCUIT AND MAGNETIC STORAGE DEVICE USING THE SAME

CROSS-REFERENCE TO RELATED APPLICATION

The present application claims priority from Japanese Patent Application JP 2004-75526 filed on Mar. 17, 2004, the content of which is hereby incorporated by reference into this application.

TECHNICAL FIELD OF THE INVENTION

The present invention relates to a semiconductor integrated circuit and a magnetic storage device using the same. More particularly, the present invention relates to a technique effectively applied to a semiconductor integrated circuit and a magnetic storage device using the same, in which data is written by supplying current to a magnetic head.

BACKGROUND OF THE INVENTION

For example, "A 550 Mb/s GMR Read/Write Amplifier using 0.5 µm 5 V CMOS Process" by Steven Lam et al. and p. 358 to 359 of "2000 IEEE International Solid-State Circuits Conference Digest of Technical Papers" (Non-patent document 1) disclose a circuit for writing data by driving a magnetic head in a magnetic storage device such as a hard disk drive.

The non-patent document 1 discloses a write circuit composed of an H-bridge circuit, and data is written through two-stage MOS transistors connected in series in the write operation in this write circuit. More specifically, one of the two-stage MOS transistors has a function to set write current and the other thereof has a function as a switch. Then, when the switch is turned on, write current is supplied to a magnetic head to write data.

In addition, an output circuit and a driver circuit are disclosed in, for example, Japanese Patent Application Laid-Open No. 5-152926, U.S. Pat. No. 6,222,780, Japanese Patent Application Laid-Open No. 8-107344, and U.S. Pat. No. 2002/0140458.

Japanese Patent Application Laid-Open No. 5-152926 discloses an output circuit in which output impedance can be varied in an analog manner. In the configuration of the output circuit, an inverter circuit located in a previous stage of a MOS transistor provided in an output stage is provided with a function to vary the power supply voltage of the inverter circuit. As a result, since the input potential of the MOS transistor in an output stage can be varied, it is possible to control the output impedance. Therefore, malfunction due to the impedance mismatch can be prevented.

U.S. Pat. No. 6,222,780 discloses a semiconductor static memory in which cell ratio difference caused by manufacturing variance can be corrected. In the configuration of the semiconductor static memory, a function to vary the power supply voltage of a word line driver is provided. Therefore, the cell ratio difference can be corrected by adjusting the potential of the word line to an appropriate value, and thus, the stable write operation and data holding operation can be realized.

In addition, Japanese Patent Application Laid-Open No. 8-107344 discloses a CMOS output circuit in which means for preventing that a P channel MOS transistor and an N channel MOS transistor are simultaneously turned on is provided so as to prevent the generation of through current. U.S. Pat. No. 2002/0140458 discloses a CMOS inverter circuit in which appropriate bias voltage in accordance with the threshold voltage of a gate terminal of a MOS transistor provided in an output stage and an input signal via an AC coupling are applied to the gate terminal of the MOS transistor so as to reduce the influence of the threshold voltage under the low voltage operation.

SUMMARY OF THE INVENTION

By the way, as a result of the examination by the inventors of the present invention for the above-described techniques of a write circuit in a magnetic storage device, the following facts are revealed.

For example, a preamplifier circuit for performing input/output operation of a write signal and a read signal to and from a magnetic head moving on the disks is provided in a hard disk drive. In the preamplifier circuit, a read circuit for amplifying the read signal from the magnetic head and a write circuit for outputting the write signal to the magnetic head are usually integrated in one IC chip.

This preamplifier circuit is desirably arranged at a location as close as possible to the magnetic head from the viewpoint of the waveform quality. Therefore, the preamplifier circuit is mounted in a small space such as on a suspension for supporting the magnetic head in many cases, and therefore, it is required that the circuit area of the preamplifier circuit is as small as possible from the viewpoint of chip cost and the like.

In such a circumstance, the write circuit in Japanese Patent Application Laid-Open No. 5-152926 has circuit configuration as shown in FIG. 9. FIG. 9 is a circuit diagram showing a configuration example of the conventional write circuit examined as a premise of the present invention.

The write circuit shown in FIG. 9 is composed of an H-bridge circuit having a branch between an output terminal ND90 and an output terminal ND91 and four branches 90 to 93 from the output terminals ND90 and ND91 to a power supply node Vcc and a reference potential node Vss. A magnetic head 1 is provided in the branch between the output terminal ND90 and the output terminal ND91. The branch 91 from the output terminal ND90 to the reference potential node Vss includes two-stage N channel MOS transistors (hereinafter, referred to as NMOS transistor) MN910 and MN911 connected in series and a replica circuit 91a constituting a current mirror circuit together with the NMOS transistor MN910.

The replica circuit 91a has a current source Iw and NMOS transistors MN912 and MN913 sequentially connected in series, and a gate terminal of the NMOS transistor MN912 is connected to a drain terminal of the NMOS transistor MN912 and a gate terminal of the NMOS transistor MN910 in common. Note that the other branches 90, 92, and 93 also have the two-stage NMOS transistors or P channel MOS transistors (hereinafter, referred to as PMOS transistor) connected in series.

When performing the data write operation in this configuration, current is applied to the magnetic head 1 through a path of the branches 90 and 93 or a path of the branches 92 and 91 so as to perform the data write in accordance with the binary data. For example, when performing the data write operation through a path of the branches 92 and 91, the NMOS transistor MN911 is turned on and the write current nIw controlled by the replica circuit 91a and the NMOS transistor MN910 is supplied to the magnetic head 1, by which the data write is performed.

However, the write circuit shown in FIG. 9 has the problems (1) to (3) shown below.

(1) Since the configuration includes the two-stage MOS transistors connected in series, the circuit area is large. More specifically, since it is necessary to apply the large current of, for example, 100 mA to the magnetic head 1, the NMOS transistors MN910 and MN911 in the output stage have a large size. In addition, since the MOS transistors are connected in series in two stages, only about half of the current passing through one MOS transistor can be passed through each of the MOS transistors. Therefore, it is necessary to increase the size of the MOS transistors.

(2) When the size of the MOS transistor is increased, it takes more time to drive the MOS transistor, which hinders the high-speed operation. Also, the area of the circuit for driving the MOS transistor is increased. More specifically, when the size of the gate capacitor increases along with the increase of the size of the NMOS transistor MN911, it takes more time to drive the NMOS transistor, and thus, it becomes necessary to increase the area of the driver circuit located in a previous stage of the NMOS transistor MN911.

(3) Since the configuration includes the two-stage MOS transistors connected in series, it is necessary to increase the voltage difference between the power supply node Vcc and the reference potential node Vss and the output terminal ND90 and the output terminal ND91. Therefore, it is difficult to achieve the overall voltage reduction.

Therefore, an object of the present invention is to provide a semiconductor integrated circuit capable of reducing the circuit area and a magnetic storage device using the same.

In addition, another object of the present invention is to provide a semiconductor integrated circuit capable of reducing the circuit area and achieving the high-speed operation and voltage reduction and a magnetic storage device using the same.

The above and other objects and novel characteristics of the present invention will be apparent from the description and the accompanying drawings of this specification.

The typical ones of the inventions disclosed in this application will be briefly described as follows.

A semiconductor integrated circuit in the present invention comprises: a single-stage output transistor provided between a power supply node or a reference potential node and an output terminal and turned on when first voltage is set to a control input terminal and turned off when second voltage is set to the control input terminal; means for generating reference current of output current generated when the output transistor is turned on; means for generating the first voltage by converting the generated reference current; and voltage switch means for switching the voltage of the control input terminal of the output transistor to the first or second voltage.

That is, the semiconductor integrated circuit uses a single-stage output transistor to turn on and off the supply of the output current. Also, when the supply is turned on, it is possible to control the output current amount by adjusting the first voltage by using the reference current. Therefore, it is possible to reduce the circuit area and also possible to achieve the voltage reduction in comparison to that of the two-stage output transistors provided for the ON/OFF switch function and the control function of the output current amount in the conventional technique. Furthermore, since the single-stage output transistor is used, the device size can be also reduced. Consequently, the high-speed operation can be achieved.

In this case, the means for generating the first voltage has a function to reduce the output impedance caused by the generation of the first voltage. More specifically, it is possible to switch the output transistor quickly by reducing the output impedance when the first voltage is supplied to the control input terminal of the output transistor.

Also, the means for switching to the first or second voltage can be realized by, for example, a CMOS circuit. In addition, the means for generating the first voltage can be realized by, for example, a diode-connected transistor having a certain device size ratio to the output transistor. More specifically, since the means for switching to the first or second voltage is realized by a CMOS circuit, the first or second voltage can be applied to the output transistor without voltage drop or the like. Furthermore, since the diode-connected transistor is used, the control of the output current can be facilitated.

Also, the semiconductor integrated circuit in the present invention comprises: a single-stage output transistor provided between a power supply node or a reference potential node and an output terminal; replica means including a transistor constituting a current mirror circuit together with the output transistor when electric conduction is provided between control input terminals and setting output current of the output transistor by using the current mirror circuit; switch means for controlling conduction between the control input terminals; means for turning off the output transistor when electric conduction is not provided between the control input terminals; and means for improving drive capability in accordance with the switching to provide electric conduction between the control input terminals.

More specifically, this semiconductor integrated circuit can control the on and off of the supply of the output current by using the single-stage output transistor, and when the supply of the output current is turned on, the amount of the output current can be controlled by using the current mirror circuit. Also, in this case, when the electric conduction is provided between the control input terminals of the current mirror circuit, the control input terminal of the output transistor is driven by the current mirror circuit. Therefore, the configuration in which the output transistor is driven via a regulator circuit is preferable for improving the drive capability.

Also, the semiconductor integrated circuit in the present invention comprises: a current source for generating electric current; a first transistor provided between a power supply node or a reference potential node and the current source, having a first control input terminal, and converting the current of a current source to the voltage of the first control input terminal by means of diode connection; a regulator circuit connected to the first control input terminal and outputting the voltage of the first control input terminal with reducing output impedance thereof; a CMOS circuit having a first power supply terminal and a first reference potential terminal to which an output of the regulator circuit is connected; and an output transistor provided between the power supply terminal or the reference potential node and an output terminal and having a second control input terminal to which an output of the CMOS circuit is connected.

Also, the semiconductor integrated circuit in the present invention comprises: a plurality of output transistors connected in parallel and provided between a power supply terminal or a reference potential node and an output terminal; a plurality of CMOS circuits connected to second control input terminals of the plurality of output transistors; a regulator circuit connected to first power supply terminals or first reference potential terminals of the plurality of CMOS circuits; a first transistor having a control input terminal connected to the regulator circuit and provided with diode connection; a current source for outputting reference current of the output current to the first transistor; and means for controlling the number of output transistors to be driven from the plurality of output transistors by individually controlling the inputs of the plurality of CMOS circuits.

In this manner, it is possible to control the drive capability of an output transistor quickly and flexibly. For example, the rise and fall of the output current becomes faster.

In addition, the semiconductor integrated circuit in the present invention is composed of an H-bridge circuit, and the above-described semiconductor integrated circuit is provided in each of the four branches except the central branch of the H-bridge circuit. More specifically, by providing a single-stage output transistor in each of the four branches, the effect of reducing the circuit area becomes more obvious in comparison to the conventional technique. In this case, since the means for generating reference current and the means for generating the first voltage can be provided in common for the four branches, the circuit area is not increased.

Also, the above-described semiconductor integrated circuit is particularly effective when applied to a write circuit in a magnetic storage device.

The effect obtained by the representative one of the inventions disclosed in this application will be briefly described as follows.

It is possible to reduce the circuit area by replacing the two-stage output transistors in the conventional technique with a single-stage output transistor. Also, since the single-stage output transistor is used, the device size of the output transistor can be reduced, and therefore, it is possible to reduce the circuit area and also possible to achieve the high-speed operation. Furthermore, owing to the single-stage output transistor, it is possible to achieve the voltage reduction and the low power consumption.

BRIEF DESCRIPTIONS OF THE DRAWINGS

Figure 8B:
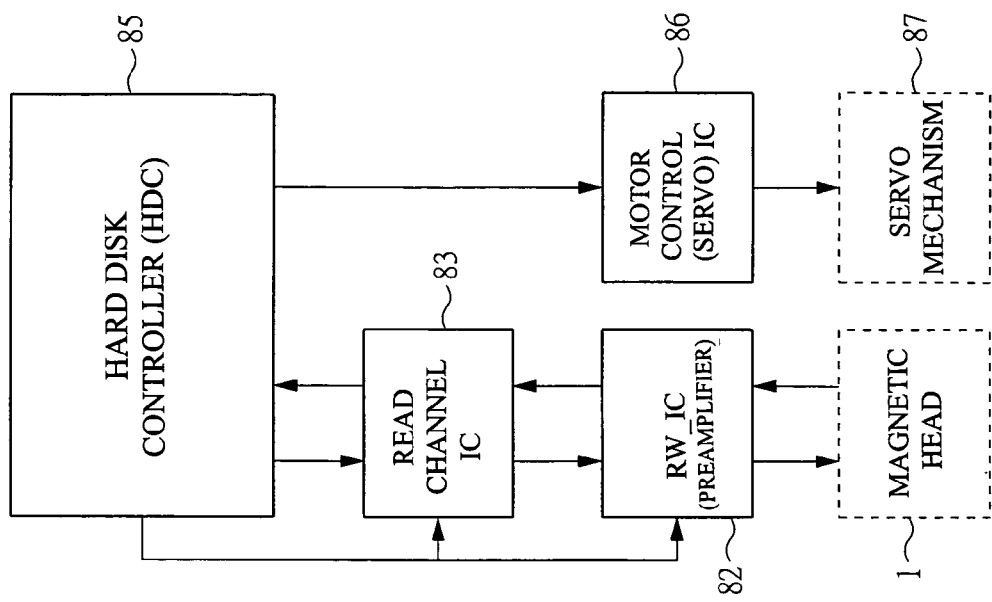
Figure 8A:
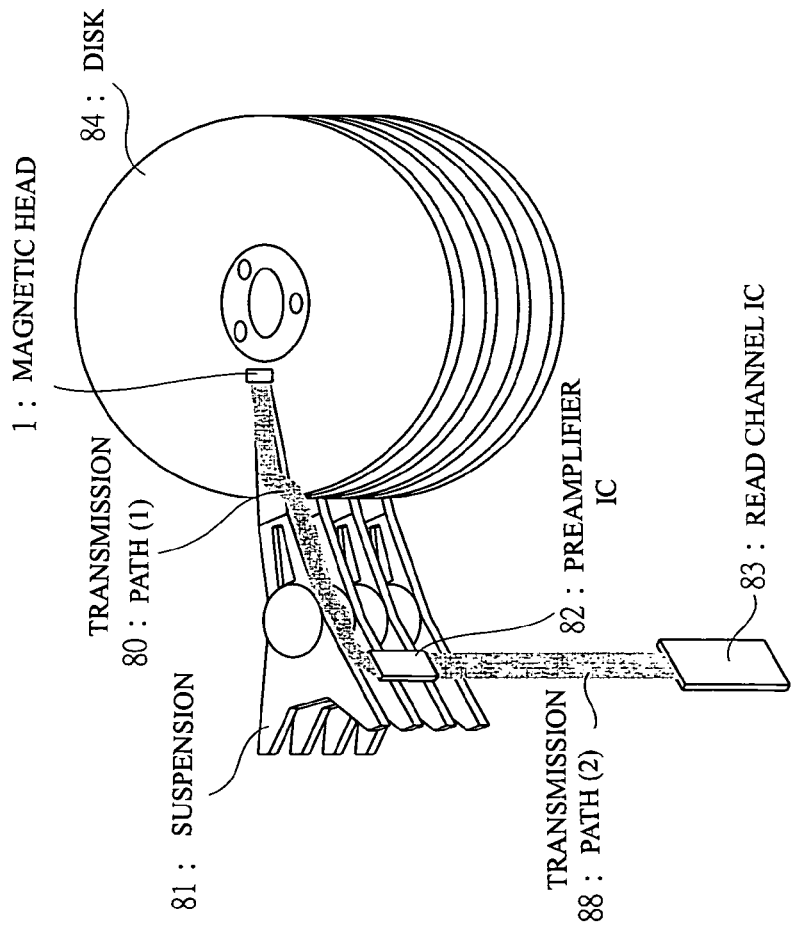
Figure 9:
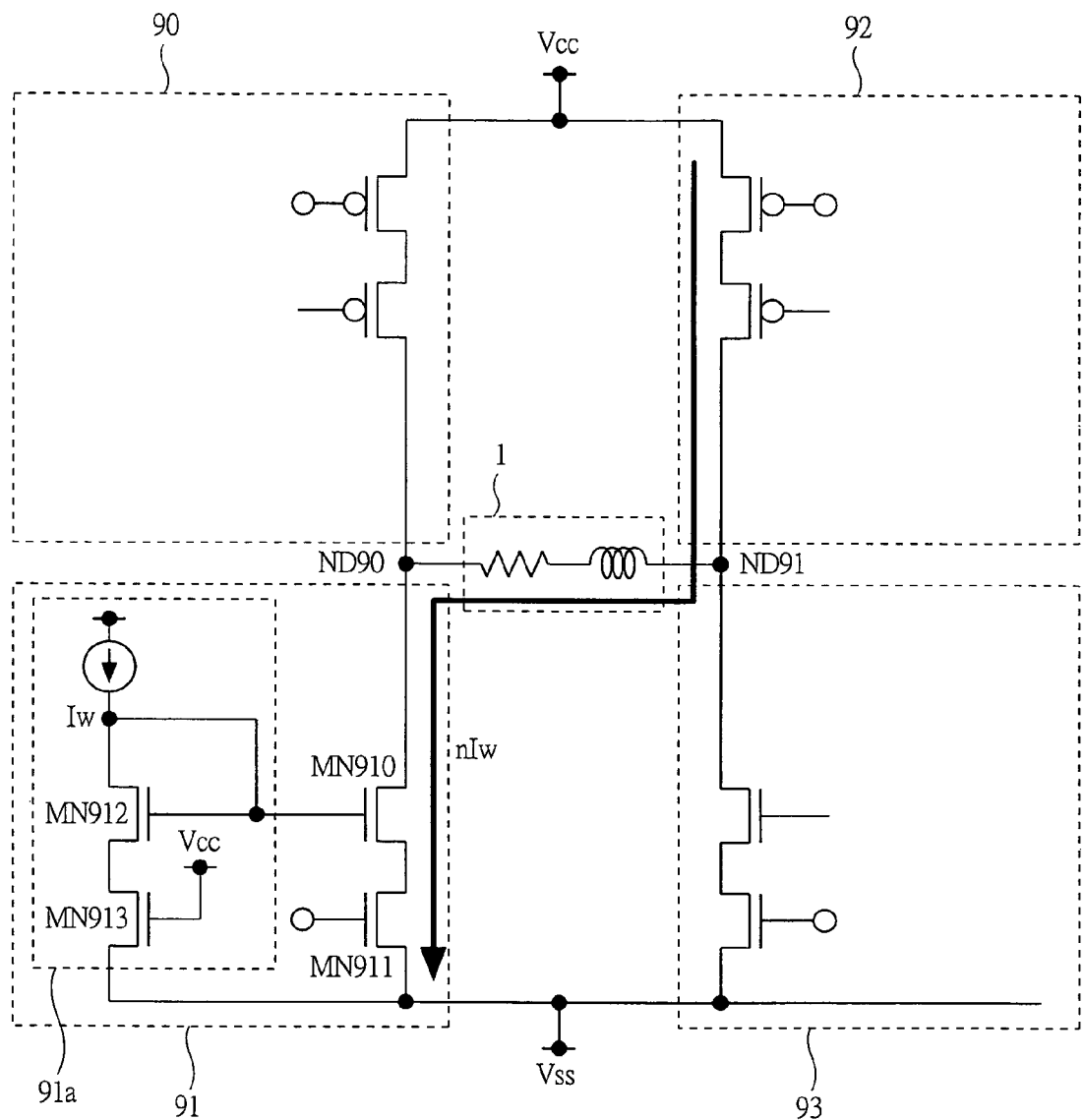

FIG. 8 is a diagram showing a configuration example of a magnetic storage device according to an embodiment of the present invention, in which FIG. 8A is a perspective view showing an external appearance thereof and FIG. 8B is a block diagram showing an example of the circuit configuration thereof; and FIG. 9 is a circuit diagram showing a configuration example of the conventional write circuit examined as a premise of the present invention.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Figure 1:
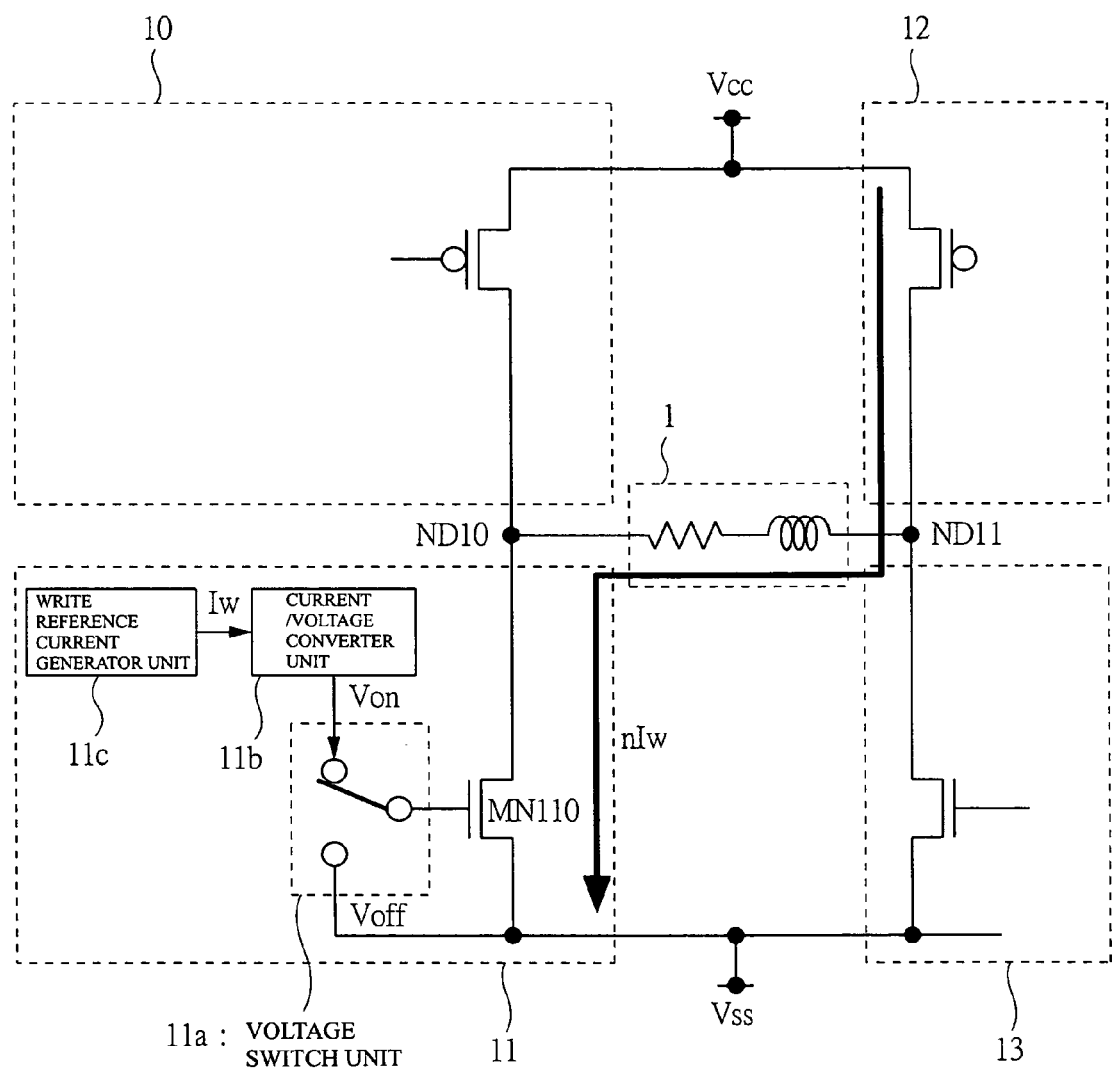
FIG. 1 is a schematic diagram showing a configuration example of a semiconductor integrated circuit according to an embodiment of the present invention.

FIG. 1 is a schematic diagram showing a configuration example of a semiconductor integrated circuit according to an embodiment of the present invention. The semiconductor integrated circuit shown in FIG. 1 is a write circuit in a magnetic storage device, in which write current is passed through a magnetic head connected between an output terminal ND10 and an output terminal ND11. Intermediate nodes in the bridges between a power supply node Vcc and a reference potential node Vss serve as the output terminal ND10 and the output terminal ND11. The magnetic head 1 connected externally and these bridges constitute an H-bridge circuit.

Each of four branches 10 to 13 of the H-bridge circuit has a single-stage PMOS transistor or NMOS transistor. When performing data write operation, current is supplied to the magnetic head 1 through the path of the branches 10 and 13 or the path of the branches 12 and 11. An internal configuration example will be described with using the branch 11 as an example.

The branch 11 includes, for example, an NMOS transistor MN110 which is a single-stage output transistor provided between the output terminal ND10 and the reference potential node Vss, a voltage switch unit 11a which switches a gate terminal (control input terminal) of the NMOS transistor MN110 between ON voltage (first voltage) Von and OFF voltage (second voltage) Voff, a current/voltage converter unit 11b which generates the ON voltage Von, and a write reference current generator unit 11c.

In the data write operation using the magnetic head 1, the write reference current generator unit 11c generates reference current Iw to be the reference of write current (output current) nIw applied between the source and drain of the NMOS transistor MN110, and the reference current Iw is outputted to the current/voltage converter unit 11b. The current/voltage converter unit 11b uses the inputted reference current Iw to generate the ON voltage Von in accordance with the write current nIw to be applied between the source and drain of the NMOS transistor MN110.

When performing the data write operation through the path of the branches 12 and 11 in the configuration as described above, the gate terminal of the NMOS transistor MN110 is set to the ON voltage Von by using the voltage switch unit 11a so as to supply the write current nIw to the magnetic head 1. Also, when data write operation is not performed through the path of the branches 12 and 11, the gate terminal of the NMOS transistor MN110 is set to the OFF voltage Voff (Vss) by using the voltage switch unit 11a. As described above, in the configuration shown in FIG. 1, the current control function and the switch function that can be provided by the two-stage output transistors connected in series in the conventional technique can be realized by the single-stage output transistor MN110.

Note that the circuit configuration has been described with using the branch 11 as an example. However, the above-described configuration can be applied to the branches 10 to 13 in the H-bridge circuit according to need. That is, the above-described configuration can be applied to, for example, all of the branches 10 to 13, only the branches 11 and 13, or only the branches 10 and 12.

By using the semiconductor integrated circuit as shown in FIG. 1, the following effects (1) to (3) can be achieved.

(1) It is possible to replace the configuration including the two-stage output transistors connected in series in the conventional technique with the configuration including the single-stage output transistor. Therefore, the circuit area corresponding to this part can be reduced to about one-quarter. More specifically, by removing the one stage of the output transistor, the circuit area can be reduced to about half. Furthermore, when using the single-stage transistor, the current equivalent to that of the two-stage output transistors connected in series can be obtained even if the device size is reduced to about half. Consequently, it is possible to reduce the circuit area to about one-quarter.

(2) Since the device size of the output transistor can be reduce to about half, the drive speed at the control input terminal thereof can be increased. Therefore, the high-speed operation can be achieved.

(3) Since this configuration includes only one stage of the output transistor, the voltage difference between the power supply node Vcc and the reference potential node Vss and that between the output terminal ND10 and the output terminal ND11 can be reduced. Therefore, it is possible to achieve the voltage reduction and low power consumption.

Figure 2:
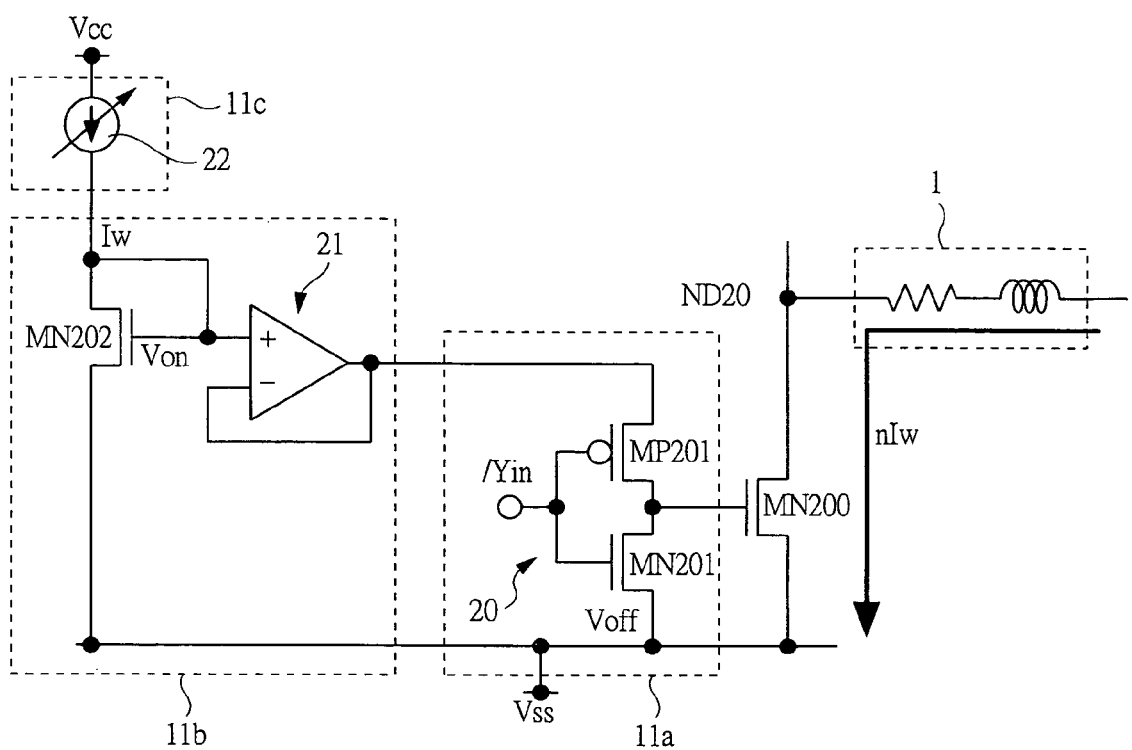
FIG. 2 is a circuit diagram showing a more concrete configuration example of a semiconductor integrated circuit in FIG. 1 according to an embodiment of the present invention.

By the way, the configuration and function described with reference to FIG. 1 can be achieved more concretely in the circuit shown in FIG. 2. FIG. 2 is a circuit diagram showing a more concrete configuration example of a semiconductor integrated circuit in FIG. 1 according to an embodiment of the present invention.

FIG. 2 is a circuit diagram showing an example of the semiconductor integrated circuit in which the branch 11 in FIG. 1 is taken as an example, and the semiconductor integrated circuit is provided with, for example, a current source 22, a diode-connected NMOS transistor (first transistor) MN202 provided between the current source 22 and a reference potential node Vss, a regulator circuit 21 for transmitting gate voltage (drain voltage) of the NMOS transistor MN202, a CMOS circuit 20 having a power supply terminal to which the voltage transmitted by the regulator circuit 21 is inputted, an NMOS transistor (output transistor) MN200 provided between the output terminal ND20 and the reference potential node Vss and setting the output voltage of the CMOS circuit 20 to the input voltage of the gate terminal (second control input terminal).

The NMOS transistor MN202 has a function to convert the current of the current source 22 to the voltage of the gate terminal (first control input terminal) by means of the diode connection. The regulator circuit 21 can be, for example, a voltage follower circuit and has a function to improve the current driver capability by reducing the output impedance when inputting the voltage. The CMOS circuit 20 has an input terminal /Yin and a PMOS transistor MP201 and an NMOS transistor MN201 between the power supply terminal and the reference potential node Vss.

Also, the output terminal ND20 is connected to the magnetic head 1. Note that the output of the regulator circuit 21 is connected to the power supply terminal (first power supply terminal) of the CMOS circuit 20 in the case of the branch 11 in FIG. 1. However, it is connected to the reference potential terminal (first reference potential terminal) of the CMOS circuit in the case of the branch 12 as described later with reference to FIG. 3.

In this configuration, the current source 22 corresponds to the write reference current generator unit 11c in FIG. 1, the NMOS transistor 202 and the regulator circuit 21 correspond to the current/voltage converter unit 11b, and the CMOS circuit 20 corresponds to the voltage switch unit 11a. Also, viewed from another perspective, it can be said that the circuit shown in FIG. 2 is a current mirror circuit composed of an NMOS transistor MN200 to be an output transistor and a replica circuit consisting of the current source 22 and the NMOS transistor MN202.

In this case, the CMOS circuit 20 has a function to control the conduction and non-conduction between the gate terminals of the current mirror circuit and to turn off the NMOS transistor MN200 in the non-conduction state. In addition, the regulator circuit 21 has a function to drive the CMOS circuit 20 and the NMOS transistor MN200 at a sufficient speed when providing electric conduction between the gate terminals.

Next, an operation of the circuit shown in FIG. 2 will be described. First, the current source 22 sets the reference current Iw. Then, when the input terminal /Yin of the CMOS circuit 20 is set to an "L" level, the electric conduction is provided between the gate terminal of the NMOS transistor MN202 and the gate terminal of the NMOS transistor MN200 in an output stage via the regulator circuit 21 and the PMOS transistor MP201 of the CMOS circuit 20, and the potential Von is set to both terminals. By doing so, the write current nIw in accordance with the device size ratio n between the NMOS transistor MN202 and the NMOS transistor MN202 flows in the path from the magnetic head 1 to the reference potential node Vss via the output terminal ND20. Meanwhile, when the input terminal /Yin of the CMOS circuit 20 is set to a "H" level, the voltage at the gate terminal of the NMOS transistor MN200 becomes Voff (Vss), and the data write operation using this path is not performed.

By using the semiconductor integrated circuit shown in FIG. 2, the configuration described in FIG. 1 can be realized more concretely, and the same effects as those in the description of FIG. 1 can be achieved. Furthermore, since the regulator circuit 21 is provided, the high-speed switching can be realized when turning on the gate terminal of the NMOS transistor MN200. Also, since the CMOS circuit 20 is used as the voltage switch unit 11a, the output voltage of the regulator circuit 21 can be applied to the gate terminal of the NMOS transistor MN200 without the voltage drop, and further, it is possible to drive the gate terminal of the NMOS transistor MN200 at high speed in both cases of ON and OFF.

Figure 3:
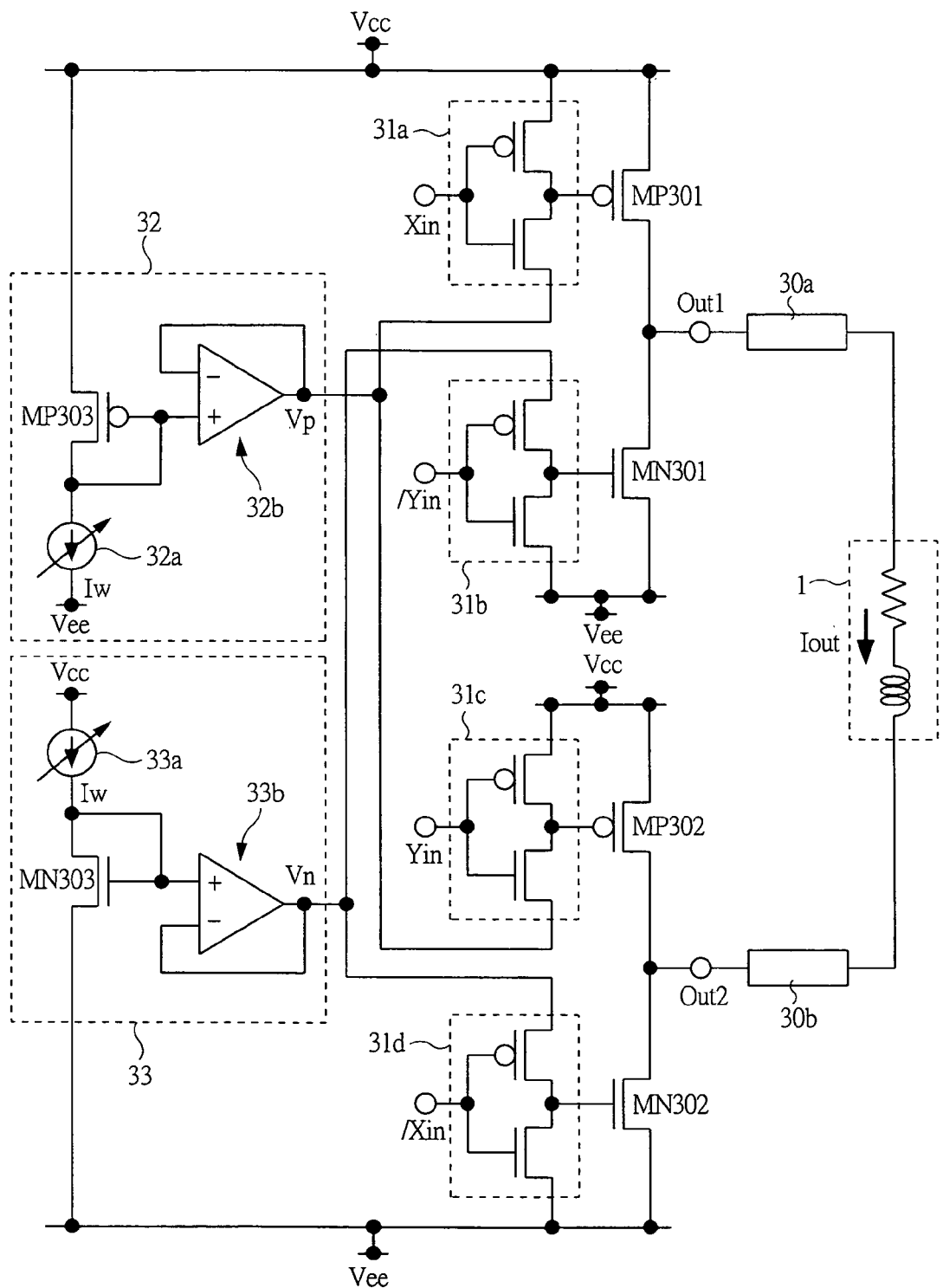
FIG. 3 is a circuit diagram showing an overall configuration example of the H-bridge circuit including the configuration in FIG. 2 in a semiconductor integrated circuit according to an embodiment of the present invention.

In the foregoing, the configuration and the like have been described with using the branch 11 of the H-bridge circuit in FIG. 1 as an example. However, when the configuration similar to that applied to the branch 11 is applied to all of the branches 10 to 13 in FIG. 1, the H-bridge circuit as shown in FIG. 3 can be formed. FIG. 3 is a circuit diagram showing an overall configuration example of the H-bridge circuit including the configuration in FIG. 2 in a semiconductor integrated circuit according to an embodiment of the present invention.

The semiconductor integrated circuit shown in FIG. 3 has an output terminal Out1 and an output terminal Out2, and the magnetic head 1 is connected therebetween via a transmission paths 30a and 30b. A PMOS transistor MP301 is connected between an intermediate node from the output terminal Out1 and the power supply node Vcc, and an NMOS transistor MN301 is connected between the intermediate node and the power supply node Vee. Similarly, a PMOS transistor MP302 is connected between an intermediate node from the output terminal Out2 and the power supply node Vcc, and an NMOS transistor MN302 is connected between the output terminal Out2 and the power supply node Vee. CMOS circuits 31a, 31b, 31c, and 31d for controlling the gate voltage are connected to the gates of these MOS transistors (output transistor) MP301, MN301, MP302, and MP302, respectively. Furthermore, write current control circuits (1)32 and (2)33 for controlling the write current by applying the voltage to the power supply terminals (first power supply terminal) or the reference potential terminals (first reference potential terminal) of the CMOS circuits 31a to 31d are provided.

The CMOS circuit 31a is provided with an input terminal Xin, a power supply terminal connected to the power supply node Vcc, and a reference potential terminal connected to a voltage supply terminal Vp, the CMOS circuit 31b is provided with an input terminal /Yin, a power supply terminal connected to a voltage supply terminal Vn, and a reference potential terminal connected to a power supply node Vee, the CMOS circuit 31c is provided with an input terminal Yin, a power supply terminal connected to the power supply node Vcc, and a reference potential terminal connected to the voltage supply terminal Vp, and the CMOS circuit 31d is provided with an input terminal /Xin, a power supply terminal connected to the voltage supply terminal Vn, and a reference potential terminal connected to the power supply node Vee.

The write current control circuit (1)32 has a current source 32a for supplying the current Iw, a diode-connected PMOS transistor MP 303 provided between the power supply node Vcc and the current source 32a, and a regulator circuit 32b to which the gate voltage of the PMOS transistor MP303 is inputted and which supplies the voltage to the voltage supply terminal Vp. The write current control circuit (2)33 has a current source 33a for supplying the current Iw, a diode-connected NMOS transistor MN303 provided between the current source 33a and the power supply node Vee, and a regulator circuit 33b to which the gate voltage of the NMOS transistor MN303 is inputted and which supplies the voltage to the voltage supply terminal Vn.

As described above, the semiconductor integrated circuit shown in FIG. 3 has the configuration in which the configuration shown in FIG. 2 is applied to all of the four branches of the H-bridge circuit. However, the write current control circuit (1)32 is provided in common for the two branches composed of the PMOS transistors MP301 and MP302, respectively. Similarly, the write current control circuit (2)33 is provided in common for the two branches composed of the NMOS transistors MN301 and MN302.

Also, since the PMOS transistor MP303 in the write current control circuit (1)32 is combined with the PMOS transistors MP301 and MP302 to form the current mirror circuit, the location of the current source 32a differs in comparison to that in the configuration in FIG. 2. Note that the voltage at the power supply node Vcc is, for example, 3.0 V and the voltage at the power supply node Vee is, for example, −3.0 V.

Figure 4:
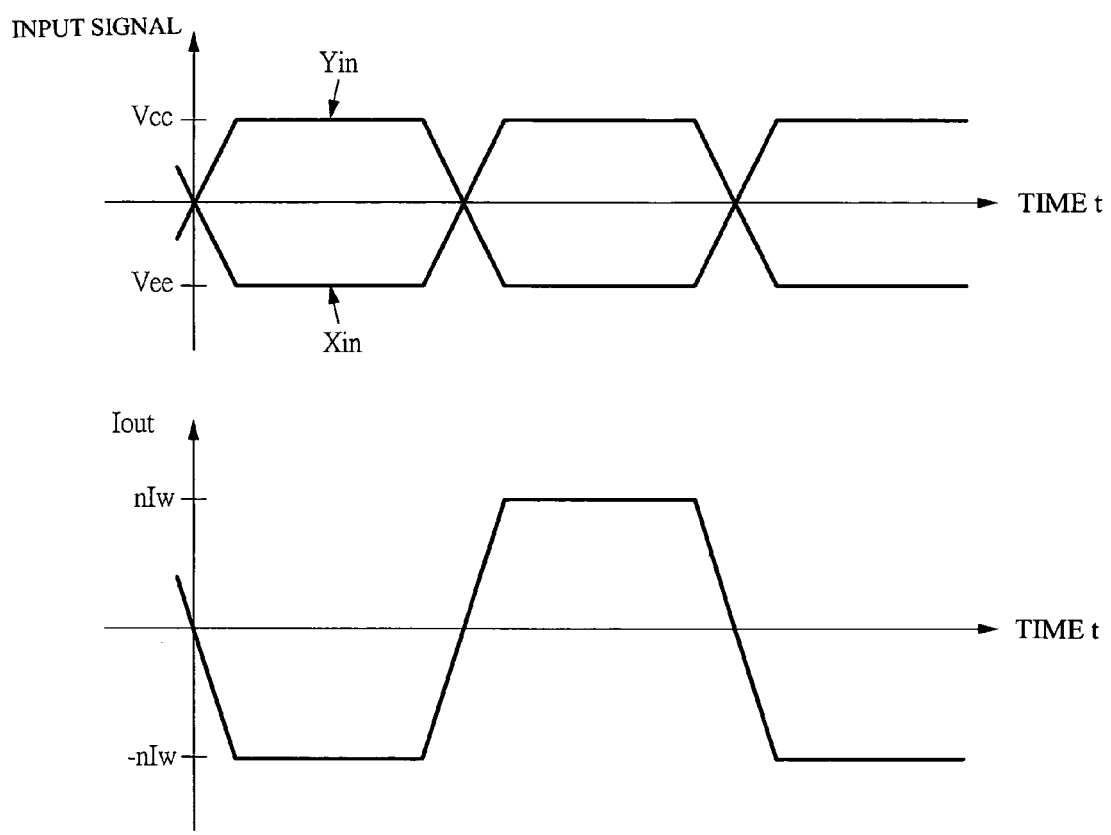
FIG. 4 is a waveform diagram showing an example of the operation in the configuration shown in FIG. 3 in a semiconductor integrated circuit according to an embodiment of the present invention.

Next, an operation of the semiconductor integrated circuit shown in FIG. 3 will be described. The operation of the individual branches in the H-bridge circuit is identical to that described in FIG. 2. Therefore, the operation of the overall H-bridge circuit will be described here with reference to FIG. 4. FIG. 4 is a waveform diagram showing an example of the operation in the configuration shown in FIG. 3 in a semiconductor integrated circuit according to an embodiment of the present invention.

FIG. 4 shows the relationship between the input signal to the input terminals of the CMOS circuits 31a to 31d and the current Iout supplied to the magnetic head 1 in response to the input signal. In this case, the "H" level is defined as a Vcc level and the "L" level is defined as a Vee level. First, when the input terminal Yin is set to the "H" level (/Yin is set to the "L" level) and the input terminal Xin is set to the "L" level (/Xin is set to the "H" level), the outputs of the CMOS circuits 31a, 31b, 31c, and 31d become Vcc level, Vn level, Vp level, and Vee level, respectively.

Therefore, the output transistors MP301, MN301, MP302, and MN302 become an OFF state, an ON state, an ON state, and an OFF state, respectively, and the write current is supplied to the magnetic head 1 via the output transistors MP302 and MN301. This write current Iout can be obtained by the equation: Iout=−n×Iw, when the device size ratio between the output transistor MP302 and the PMOS transistor MP303 and that between the output transistor MN301 and the NMOS transistor MN302 are both defined as n.

On the other hand, when the input terminal Yin is set to the "L" level (/Yin is set to the "H" level) and the input terminal Xin is set to the "H" level (/Xin is set to the "L" level), the outputs of the CMOS circuits 31a, 31b, 31c, and 31d become Vp level, Vee level, Vcc level, and Vn level, respectively.

Therefore, the output transistors MP301, MN301, MP302, and MN302 become an ON state, an OFF state, an OFF state, and an ON state, respectively, and the write current is supplied to the magnetic head 1 via the output transistors MP301 and MN302. This write current Iout can be obtained by the equation: Iout=n×Iw, when the device size ratio between the output transistor MP301 and the PMOS transistor MP303 and that between the output transistor MN302 and the NMOS transistor MN303 are both defined as n.

As described above, the configuration shown in FIG. 3 has a current source on both of the current supply side and the current absorption side and performs the data write through the operation as described above. Consequently, the speed to switch the write current can be increased and the high-speed operation can be achieved in comparison to the case where the current source is provided to only one of the current supply side and the current absorption side. Also, since the power supply node Vcc is set to the positive voltage (for example, 3.0 V) and the power supply node Vee is set to the negative voltage (for example, −3.0 V), the output potential is always kept at almost 0 V level. Therefore, the potential of the magnetic head 1 is also kept at almost 0 V level, and thus, it is possible to prevent the electrostatic charge between the magnetic head and the disk.

Figure 5:
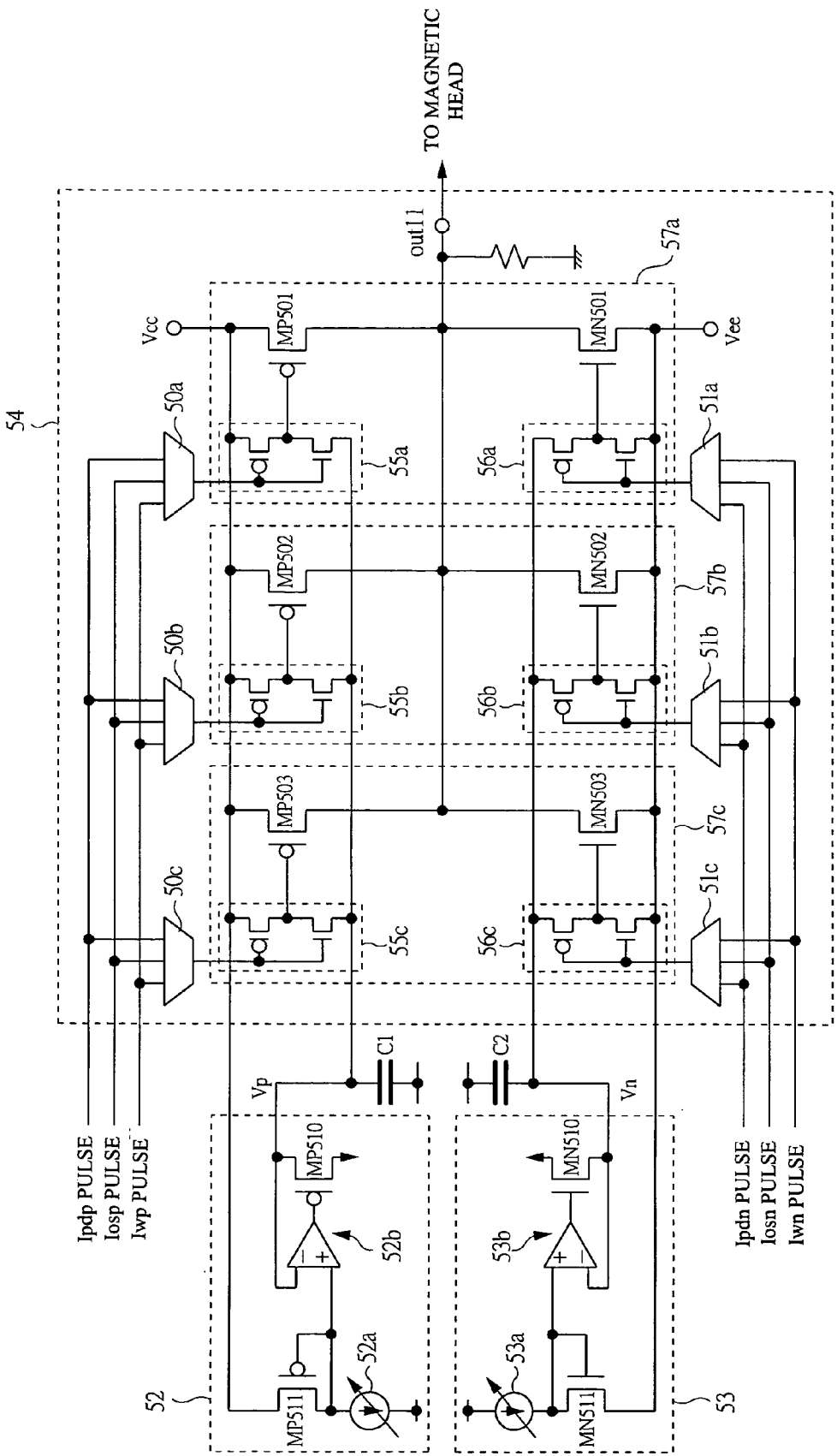
FIG. 5 is a circuit diagram showing a configuration example based on the configuration in FIG. 3 in a semiconductor integrated circuit according to an embodiment of the present invention.

By the way, in the magnetic storage device, the waveform rounding in the write current occurs in some cases due to, for example, the influence from the capacitance of the transmission paths 30a and 30b shown in FIG. 3. For its prevention, for example, the circuit as shown in FIG. 5 is formed based on the configuration in FIG. 3. FIG. 5 is a circuit diagram showing a configuration example based on the configuration in FIG. 3 in a semiconductor integrated circuit according to an embodiment of the present invention.

The configuration of the semiconductor integrated circuit shown in FIG. 5 corresponds to, for example, the configuration of the branch including the output transistor MP301 and the output transistor MN301 which are the output circuits to the output terminal Out1 in the semiconductor integrated circuit shown in FIG. 3. And the semiconductor integrated circuit shown in FIG. 5 includes, for example, write current control circuits (11)52 and (22)53, a write current variable driver unit 54, and the like.

The write current variable driver unit 54 is composed of, for example, a plurality of PMOS transistors (output transistor) MP501, MP502, and MP503 connected in parallel between the power supply node Vcc and the output terminal Out11, a plurality of CMOS circuits 55a, 55b, and 55c for driving the gate terminals of the PMOS transistors MP501, MP502, and MP503, a plurality of NMOS transistors (output transistor) MN501, MN502, and MN503 controlled in parallel between the output terminal Out 11 and the power supply node Vee, a plurality of CMOS circuits 56a, 56b, and 56c for driving the gate terminals of the NMOS transistors MN501, MN502, and MN503, selectors 50a, 50b, and 50c respectively connected to the input terminals of the CMOS circuits 55a, 55b, and 55c, and selectors 51a, 51b, and 51c respectively connected to the input terminals of the CMOS circuits 56a, 56b, and 56c.

The CMOS circuits 55a, 55b, and 55c are connected to the power supply node Vcc on their PMOS transistor side and connected to the voltage supply terminal Vp on their NMOS transistor side, and the CMOS circuits 56a, 56b, and 56c are connected to the voltage supply terminal Vn on their PMOS transistor side and connected to the power supply node Vee on their NMOS transistor side.

The voltage of the voltage supply terminal Vp and the voltage supply terminal Vn is supplied from the write current control circuit (11)52 and the write current control circuit (22)53, respectively. The write current control circuit (11)52 has a current source 52a, a diode-connected PMOS transistor MP511, and a regulator circuit 52b, and the write current control circuit (22)53 has a current source 53a, a diode-connected NMOS transistor MN511, and a regulator circuit 53b. In the regulator circuits 52b and 53b, the output of the amplifier is driven again by the PMOS transistor MP510 and the NMOS transistor MN510 for the negative feedback.

The selectors 50a, 50b, and 50c individually select one of the pulses of Ipdp pulse, Iosp pulse, and Iwp pulse and output the selected pulse to the CMOS circuit. Similarly, the selectors 51a, 51b, and 51c individually select one of the pulses of Ipdn pulse, Iosn pulse, and Iwn pulse and output the selected pulse to the CMOS circuit.

As described above, the semiconductor integrated circuit device shown in FIG. 5 has the configuration in which the PMOS transistor MP301 in the output stage in FIG. 3 is replaced by the PMOS transistors MPS01, MP502, and MP503 connected in parallel and the NMOS transistor 301 in the output stage in FIG. 3 is replaced by the NMOS transistors MN501, MN502, and MN503 connected in parallel.

Also, in the semiconductor integrated circuit shown in FIG. 5, since the PMOS transistors MP501, MP502, and MP503 connected in parallel and the NMOS transistors MN501, MN502, and MN503 connected in parallel are individually controlled by the Ipdp pulse, Iosp pulse, and Iwp pulse, and the Ipdn pulse, Iosn pulse, and Iwn pulse, the number of output transistors to be driven can be controlled quickly and flexibly. More specifically, the semiconductor integrated circuit shown in FIG. 5 has a function to vary the drive capability of the write current.

Figure 6:
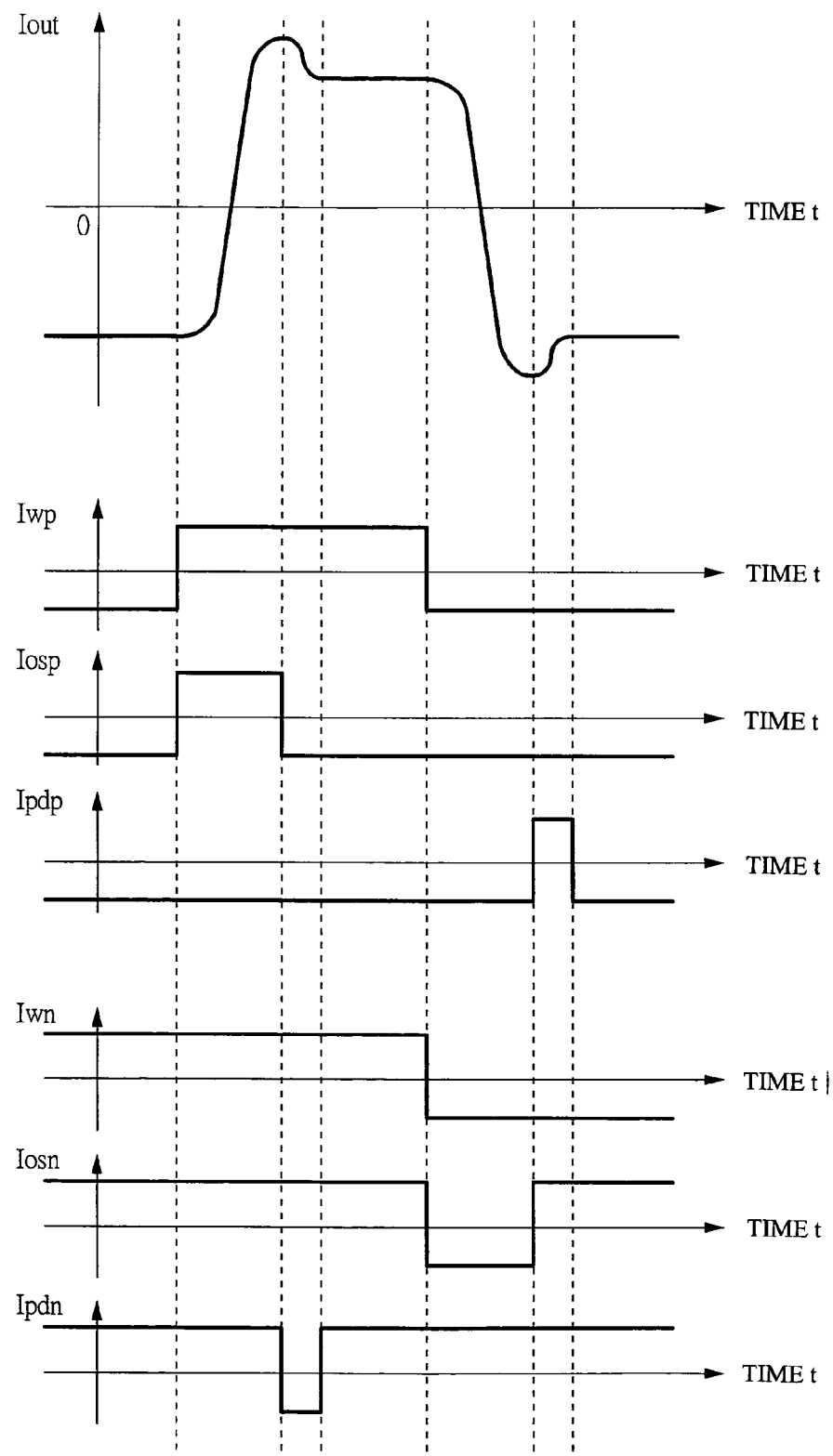
FIG. 6 is a waveform diagram showing an example of the operation using the configuration in FIG. 5 in a semiconductor integrated circuit according to an embodiment of the present invention.

Therefore, in this configuration, when the part including the output transistors MP501 and MN501 is defined as an Iw driver unit 57a, the part including the output transistors MP502 and MN502 is defined as an Ios driver unit 57b, and the part including the output transistors MP503 and MN503 is defined as an Ipd driver unit 57c, respectively, the operation as shown in FIG. 6 can be performed.

FIG. 6 is a waveform diagram showing an example of the operation using the configuration in FIG. 5 in a semiconductor integrated circuit according to an embodiment of the present invention. FIG. 6 shows the operating waveforms in the case where the Iwp pulse and Iwn pulse, the Iosp pulse and Iosn pulse, and the Iwp pulse and Iwn pulse are allocated to the Iw driver unit 57a, the Ios driver unit 57b, and the Ipd driver unit 57c, respectively, by using the selectors 50a to 50c and the selectors 51a to 51c in FIG. 5.

In this case, the Iw driver unit 57a has a function to supply the normal write current, the Ios driver unit 57b has a function to supply overdrive current for making the rise and fall faster, and the Ipd driver unit 57c has a function to supply the current for quickly recovering the excessive current value due to the overdrive to a normal write current value.

More specifically, as shown in FIG. 6, at the time of the rise of the write current Iout, the Iosp pulse in addition to the Iwp pulse are set to "H" level. By doing so, the output transistor MP502 in addition to the output transistor MP501 are driven to make the rise of the write current Iout faster. However, this causes the overshoot current in the current waveform Iout.

Therefore, the Iosp pulse is returned to the "L" level and the Ipdn pulse is set to the "L" level instead. By doing so, the output transistor MN503 instead of the output transistor MP502 is driven to suppress the overshoot current quickly. Then, by returning the Ipdn pulse to the "H" level, only the output transistor MP501 is driven and thus the stable write current is supplied thereafter.

Also, the similar operation is performed at the time of the fall of the write current Iout. As described above, in the above-described configuration, the high-speed writing can be achieved, and the waveform rounding caused by the transmission path and the like can be corrected. Note that, in addition to the operation described above, the drive capability can be flexibly controlled by changing the input method of the pulses and the device size of the output transistor in the configuration in FIG. 5.

Figure 7:
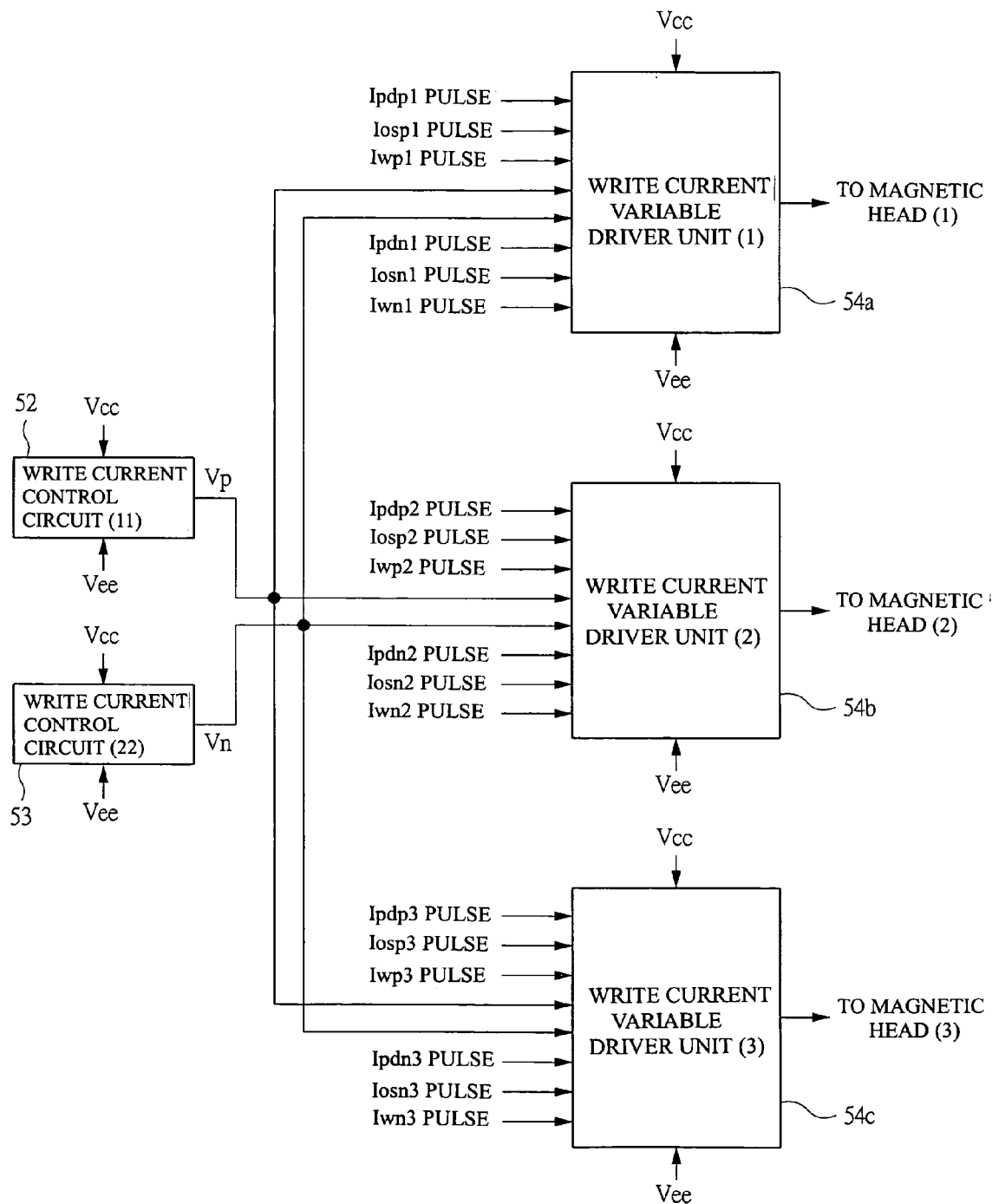
FIG. 7 is a block diagram showing a configuration example in which a plurality of the configurations of FIG. 5 are provided in a semiconductor integrated circuit according to an embodiment of the present invention.

Note that the write circuit for one magnetic head 1 is shown in the foregoing description. However, if a plurality of magnetic heads (multiple channels) are provided in a magnetic storage device, the write circuit has the configuration as shown in FIG. 7. FIG. 7 is a block diagram showing a configuration example in which a plurality of the configurations of FIG. 5 are provided in a semiconductor integrated circuit according to an embodiment of the present invention.

The semiconductor integrated circuit shown in FIG. 7 is formed to drive, for example, the magnetic heads (1), (2), and (3) of three channels. The configuration thereof includes the write current control circuits (11)52 and (22)53 shown in FIG. 5, and write current variable driver units (1)54a, (2)54b, and (3)54c each corresponding to the magnetic heads (1), (2), and (3) and having the same configuration as the write current variable driver unit 54 shown in FIG. 5, in which the write current control circuits (11)52 and (22)53 are used in common for the plurality of write current variable driver units (1)54a, (2)54b, and (3)54c.

Therefore, even when the number of write current variable driver units is increased along with the increase of the number of channels of the magnetic heads, the circuit area of the write current control circuit is not increased. Furthermore, with respect to the write current variable driver unit, the effect of reducing the circuit area achieved by using the above-described single-stage output transistor becomes more obvious when the number of the write current variable drive units is increased.

As described above, the semiconductor integrated circuit having the above-described effects is particularly effective when applied to a preamplifier circuit in a magnetic storage device as shown in FIG. 8. FIG. 8 is a diagram showing a configuration example of a magnetic storage device according to an embodiment of the present invention, in which FIG. 8A is a perspective view showing an external appearance thereof and FIG. 8B is a block diagram showing an example of the circuit configuration thereof.

The magnetic storage device shown in FIG. 8 is, for example, a hard disk drive. As shown in FIG. 8A, it includes disks 84 having magnetic anisotropy in a vertical or horizontal direction, a magnetic head 1 which writes or reads magnetic data to/from the disk 84, a suspension 81 having the magnetic head 1 fixed thereto and moving the magnetic head 1 on the disk 84 in accordance with the location for storing the data, a preamplifier IC 82 connected via a transmission line (1) 80 to the magnetic head 1 and mounted on the suspension 81, and a read channel IC 83 connected via a transmission line (2) 88 to the preamplifier IC 82.

Also, FIG. 8B shows a block diagram of the circuit for controlling the above-described magnetic storage device, which includes a hard disk controller (HDC) 85 constituting an interface between the magnetic storage device and a host system (personal computer or digital equipment) and controlling the transmission of read/write data, a read channel IC 83 for performing signal processing such as data modulation/demodulation, an RW_IC (preamplifier IC) 82 provided with a circuit for supplying current to the magnetic head 1 so as to write data and a circuit for amplifying the signal read by the magnetic head 1, and a motor control (servo) IC 86 for controlling a servo mechanism 87 such as an operating mechanism of the suspension 81 and a rotating mechanism of the disk 84.

In the configuration of this magnetic storage device, the semiconductor integrated circuit described above is particularly effective when applied to a date write circuit composed of the preamplifier IC 82. More specifically, as shown in FIG. 8A, the preamplifier IC 82 is provided in a small area such as on the suspension 81 in many cases for the purpose of reducing the length from the magnetic head 1. Therefore, not only the high speed characteristics but also the space-saving characteristics are particularly required for the preamplifier IC 82. These requirements can be satisfied by using the semiconductor integrated circuit described above.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, although a write circuit in a magnetic storage device is taken as an example in the description above, the present invention is not limited to this, and it can be widely applied as a high-speed write circuit and output circuit driven by current. More specifically, it can be applied to, for example, a communication driver in which the high-speed operation is required and the rise and fall time of the waveform (through rate) is defined.

The semiconductor integrated circuit in the present invention is particularly effective when applied to a write circuit of a magnetic storage device such as a hard disk drive, and further, it can be widely applied to a driver circuit such as an electric motor driver, a display driver, and a communication driver in addition to the write circuit.

What is claimed is:

1. A semiconductor integrated circuit, comprising:
   a single-stage output transistor provided between a power supply node or a reference potential node and an output terminal and turned on when first voltage is set to a control input terminal and turned off when second voltage is set to said control input terminal;
   a current source for generating reference current of output current generated when said output transistor is turned on;
   a converter circuit for generating said first voltage by converting said generated reference current; and
   a voltage switch circuit for switching the voltage of said control input terminal of said output transistor to said first or second voltage.

2. The semiconductor integrated circuit according to claim 1,
   wherein said converter circuit has a function to reduce output impedance caused by the generation of said first voltage.

3. The semiconductor integrated circuit according to claim 2,
   wherein said voltage switch circuit is realized by a CMOS circuit.

4. The semiconductor integrated circuit according to claim 1,
   wherein said converter circuit includes a diode-connected transistor having a certain device size ratio to said output transistor.

5. A magnetic storage device, comprising:
   a write circuit for writing data by supplying current to a magnetic head,
   wherein said write circuit includes the semiconductor integrated circuit according to claim 1.

6. A semiconductor integrated circuit, comprising:
   a single-stage output transistor provided between a power supply node or a reference potential node and an output terminal;
   a replica circuit including a transistor combined with said output transistor to constitute a current mirror circuit when electric conduction is provided between control input terminals, and setting output current of said output transistor;
   a switch circuit for controlling conduction and non-conduction between said control input terminals and turning off said output transistor when electric conduction is not provided between said control input terminals; and
   means for improving drive capability in accordance with the switching performed by said switch circuit to provide electric conduction between said control input terminals.

7. The semiconductor integrated circuit according to claim 6,
   wherein said switch circuit is realized by a CMOS circuit, and
   said means for improving drive capability is realized by a regulator circuit.

8. A semiconductor integrated circuit, comprising:
   a current source for generating electric current;
   a diode-connected first transistor connected between a power supply node or a reference potential node and said current source and generating output voltage corresponding to current of said current source to a connection node to said current source;
   a regulator circuit connected to a connection node between said current source and said current-voltage converter circuit and outputting the output voltage of said first transistor with reducing output impedance thereof;
   a CMOS circuit to which voltage of said power supply node or said reference potential node and output voltage of said regulator circuit are supplied and a switching signal is inputted, and outputting said output voltage of the regulator circuit as a control output signal when said switching signal represents an on state and outputting said voltage of the power supply node or the reference potential node as said control output signal when said switching signal represents an off state; and an output transistor provided between said power supply node or said reference potential node and an output terminal and controlled by said control output signal obtained from said CMOS circuit.

9. The semiconductor integrated circuit according to claim 8,
wherein said regulator circuit is a voltage follower circuit.

10. A semiconductor integrated circuit, comprising:
a current source for generating electric current;
a diode-connected first transistor connected between a power supply node or a reference potential node and said current source and generating output voltage corresponding to the current of said current source to a connection node to said current source;
a regulator circuit connected to a connection node between said current source and said first transistor and outputting the output voltage of said first transistor with reducing output impedance thereof;
a plurality of output transistors connected to a common output terminal connected to a load; and
a plurality of CMOS circuits connected to each of control input terminals of said plurality of output transistors,
wherein voltage of said power supply node or said reference voltage terminal and output voltage of said regulator circuit are supplied to each of said CMOS circuits,
individual switching signals are inputted to said CMOS circuits,
said CMOS circuits transmit the output voltage of said regulator circuit to a control input terminal of the corresponding output transistor when said switching signal represents an on state and transmit the voltage of said power supply node or the reference potential node when said switching signal represents an off state, thereby individually controlling said corresponding output transistors.

11. A semiconductor integrated circuit, comprising:
a first bridge between a first power supply potential node and a second power supply potential node and having an intermediate node therebetween connected to a first output terminal; and
a second bridge between said first power supply potential node and said second power supply potential node and having an intermediate node therebetween connected to a second output terminal,
wherein a first branch between said intermediate node of the first bridge and said first power supply potential node includes a first output transistor of a first conductivity type and a first CMOS circuit which is connected to a gate of said first output transistor, controls ON and OFF of said first transistor, and controls output current in an on state, a second branch between said intermediate node of the first bridge and said second power supply potential node includes a second output transistor of a second conductivity type and a second CMOS circuit which is connected to a gate of said second output transistor, controls ON and OFF of said second output transistor, and controls output current in an on state, a third branch between said intermediate node of the second bridge and said first power supply potential node includes a third output transistor of a first conductivity type and a third CMOS circuit which is connected to a gate of said third output transistor, controls ON and OFF of said third output transistor, and controls output current in an on state, a fourth branch between said intermediate node of the second bridge and said second power supply potential node includes a fourth output transistor of a second conductivity type and a fourth CMOS circuit which is connected to a gate of said fourth output transistor, controls ON and OFF of said fourth output transistor, and controls output current in an on state, a first current control circuit for applying first control voltage, which defines a limit value of output current when the corresponding output transistors are in an on state, to said first CMOS circuit and said third CMOS circuit is provided, and a second current control circuit for applying second control voltage, which defines a limit value of output current when the corresponding output transistors are in an on state, to said second CMOS circuit and said fourth CMOS circuit is provided.

12. The semiconductor integrated circuit according to claim 11,
wherein said first current control circuit includes a first current source for generating first reference current, a first current-voltage converter circuit provided between said first power supply potential node and said first current source, and a first regulator circuit for outputting the output voltage of said first current-voltage converter circuit to said first CMOS circuit and said third CMOS circuit with reducing the output impedance thereof, and
said second current control circuit includes a second current source for generating second reference current, a second current-voltage converter circuit provided between said second power supply potential node and said second current source, and a second regulator circuit for outputting the output voltage of said second current-voltage converter circuit to said second CMOS circuit and said fourth CMOS circuit with reducing the output impedance thereof.

* * * * *